United States Patent [19]

Schmidt et al.

[11] Patent Number: 5,378,314

[45] Date of Patent: Jan. 3, 1995

[54] METHOD FOR PRODUCING SUBSTRATES WITH PASSAGES

[75] Inventors: Walter Schmidt, Zürich; Marco Martinelli, Neftenbach, both of Switzerland

[73] Assignee: Dyconex Patente AG, Zug, Switzerland

[21] Appl. No.: 77,298

[22] Filed: Jun. 15, 1993

[30] Foreign Application Priority Data

Jun. 15, 1992 [CH] Switzerland ............. 01874/92
Jun. 15, 1992 [GB] United Kingdom ........ 9212648
May 17, 1993 [CH] Switzerland ............. 01501/93

[51] Int. Cl.$^6$ .............. B44C 1/22; B29C 37/00; C23F 1/00
[52] U.S. Cl. .................. 156/644; 156/656; 156/902; 156/668
[58] Field of Search .......... 156/644, 656, 659.1, 156/661.1, 901, 902, 668, 651; 29/852; 427/97

[56] References Cited

U.S. PATENT DOCUMENTS

| 3,354,543 | 11/1967 | Lawrence et al. | 156/644 X |
| 4,118,523 | 10/1978 | Chorles et al. | 427/97 |
| 4,472,238 | 9/1984 | Johnson | 156/643 |
| 5,205,902 | 4/1993 | Horton et al. | 156/643 |

FOREIGN PATENT DOCUMENTS 2141897 3/1973 Germany.
2-60188 2/1990 Japan.

*Primary Examiner*—William Powell
*Attorney, Agent, or Firm*—Walter C. Farley

[57] ABSTRACT

A method for producing aligned passages through substrate materials, in which the projection of the inlet and outlet openings does not coincide, uses displaced application of etching windows on opposite sides and corresponding pronounced under-etching of these windows. By applying displaced etching windows on both sides of the substrate and through-etching the substrate through these windows, 'oblique' passages are obtained through the substrate. By a suitable location of the windows it is also possible to produce branched passages with more than one outlet opening.

7 Claims, 3 Drawing Sheets

METHOD FOR PRODUCING SUBSTRATES WITH PASSAGES

FIELD OF THE INVENTION

The invention relates to a method for producing substrates with passages, particularly foil circuit boards with plated-through holes.

BACKGROUND OF THE INVENTION

The two layouts of a two-layer circuit board located on opposite sides of a flat substrate are normally electrically interconnected by passages plated-through the substrate. These passages are usually mechanically drilled and are then e.g., plated-through using an electroplating process. The layouts of the conductor planes are produced in process steps largely independent of the production of the plated-through holes, conventionally using photochemical and wet chemical processes and flat extensions of the conducting paths or so-called lands are provided around the openings of the holes on both sides. The lands associated with a plated-through hole must necessarily precisely be opposite one another and must at least be sufficiently large that they still extend around the opening of the plated-through hole when summating all the imprecisions which are possible in the method.

The upper limit for the functional density of such circuit boards is inter alia determined by the diameter of the drilled passages, which is minimally at least 0.2 mm and by the dimensions of the associated lands. This upper limit, as obtained with the method using drilled holes, has long been much too low for the requirements made on circuit boards and is therefore circumvented by super-imposing a large number of circuit board planes. The disadvantages inherent in such a development are known and have led to the wish for increasing the functional density within the conductor planes, so that the necessary number of conductor planes can again be limited.

Foil technology offers a number of possibilities, the circuit boards being produced from metal-clad foil material and, instead of the passages for the plated-through holes being drilled, they are etched and in particular plasma etched. The starting product is normally a foil or film of an electrically insulating polymer, e.g. polyimide or epoxy resin coated on both sides with metal, e.g. copper.

For producing the plated-through holes the metal coatings are removed photochemically on both sides at the locations of the openings of the passages. The polymer layer is then etched through at the exposed points from both sides to form a through hole and this typically takes place by plasma etching. These passages are e.g. plated-through by electroplating. Then in further, normally photochemical process steps, the layouts are structured on the metal coatings.

Plated-through holes produced according to such a method can have diameters down to approximately 5/100 mm, so that the functional density is drastically increased compared with the drilling method referred to hereinbefore. Great importance is attached in this method to the dimensioning and positioning of the lands, because it is not only the plated-through holes per se, but also the lands which take up space in the conductor planes and consequently determine the functional density.

However, as the sizes for conductor structures produced according to foil technology are approximately a power of 10 smaller as compared with the sizes obtainable by drilling technology, as a result of the plated-through holes and their tolerances, layout requirements become more important, particularly as the tolerances retain the same order of magnitude. It would therefore be desirable for an optimum utilization of the advantages of foil technology to reduce or obviate such layout requirements.

SUMMARY OF THE INVENTION

An object of the invention is to provide a method of forming oblique passages which can then be plated to form plated-through holes plated-through holes oblique passages can be provided, i.e. passages, whose axes are not perpendicular to the flat extension of the substrate. Such oblique passages can be produced by etching technology, a more or less pronounced undercutting of the foil being required as a function of the displacement or offset of the two openings in the metal claddings provided for the passage mouths.

The incorporation of oblique passages through the substrate for plated-through holes and a corresponding choice of the etching parameters allow a further increase of the functional density within a conductor plane for two reasons:

On the one hand the incorporation of passages not perpendicular to the substrate surface in the layout design allows limited freedom in the positioning of the lands associated with a plated-through hole, i.e. a reduction of the layout requirement of the facing lands. These lands need not necessarily be opposite one another in precise manner and can instead be mutually displaced at least to a certain extent, i.e., so that projection of one opening does not coincide with an opening on the opposite side of the substrate, so that there is a limited freedom of one layout with respect to the other and this can be used for space saving and/or conductor shortening. This also makes it possible to produce branching passages, i.e. passages with an opening or mouth on one substrate side and several openings or mouths on the other substrate side, which provides new degrees of freedom in the design of circuit boards or other substrates.

On the other hand through the possibility of oblique passages the size of the lands made necessary by tolerance conditions can be limited, because there is no need to incorporate an amount of material sufficient to cover an offset or displacement of the two passage openings. Such displacement is unimportant if the etched hole merely connects the two predetermined openings, no matter whether said two openings are mutually displaced or not. In the calculation for the minimum necessary size of the lands, it is only necessary to include imprecisions relating to one side of the circuit board. The relative position of the layout of one side relative to the layout of the other side can be ignored. For this it is necessary to adjust the etching parameters in such a way that even with a maximum expected displacement imprecision, there is still a hole through the substrate.

Examples of the inventive procedure are discussed hereinafter relative to the drawings.

DESCRIPTION OF THE PREFERRED EMBODIMENTS

Figure 1A:
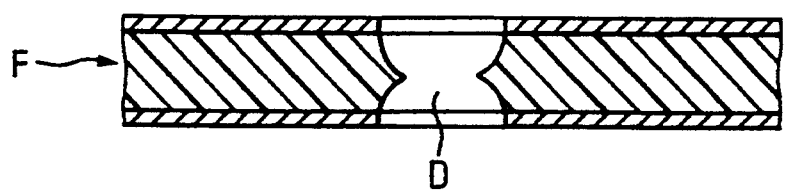
FIGS. 1a and 1b are schematic side elevations, in section, of printed circuit boards showing holes etched through metal-clad foils on opposite sides thereof with no undercutting in FIG. 1a and with undercutting in FIG. 1b.
Figure 1B:
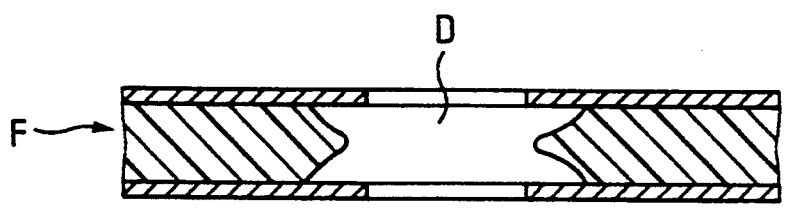

FIGS. 1a and 1b show etched passages D through a foil material F metal-clad on both sides. For producing the passage according to FIG. 1a the etching parameters must be so selected that a passage is obtained which, with the represented ratio of substrate thickness to diameter of the opening provided, does not lead to undercutting or, more accurately, under-etching FIG. 1b shows the same passage with clear undercutting. For process economy reasons the etching according to FIG. 1a is preferred, but may not be sufficient with respect to a displacement of the two openings, as will be described in conjunction with FIG. 3.

Figure 2:
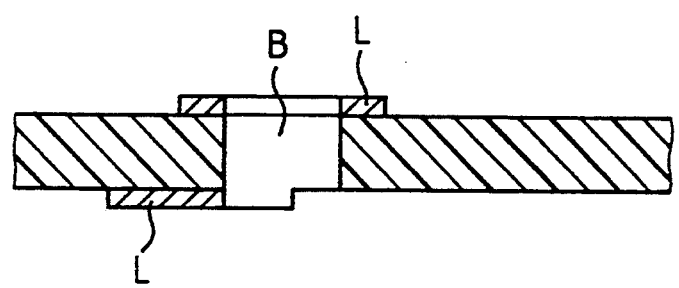
FIG. 2 is a side elevation, in section, of a printed circuit board showing a typical flaw created by a layout displacement between two sides of a substrate through which passages were created by drilling.

FIG. 2 shows a piece of circuit board with a drilled passage B and on either side the lands L associated with said passage, which are intentionally or unintentionally mutually displaced. As a result of this displacement the land only partially surrounds the lower side of the passage opening, which leads to rejection when the passage through. This would be preventable by using larger lands, but they require more space on the conductor plane, thereby reducing the functional density, or by the production of an oblique hole, which is impossible by drilling.

Figure 3:
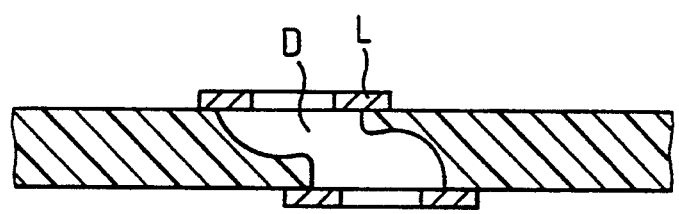
FIG. 3 is a side elevation, in section, of a printed circuit board showing an effect of layout displacement with passages created in accordance with the invention.

FIG. 3 shows an etched passage D through a substrate, the lands L associated with the passage being mutually displaced for tolerance or layout reasons. The passage is are oblique and it must be borne in mind that, with a larger displacement of the lands, clearly greater under-etching is necessary to actually bring about a passage. This means that the etching parameters must be such that the most oblique passage can still be through-etched and that in spite of this the under-etching is still acceptable in the case of less oblique passages. This condition simultaneously provides the upper limit for the obliqueness of a passage and this is in turn dependent on the substrate thickness, the diameter of the openings and the substrate material.

Figure 4:
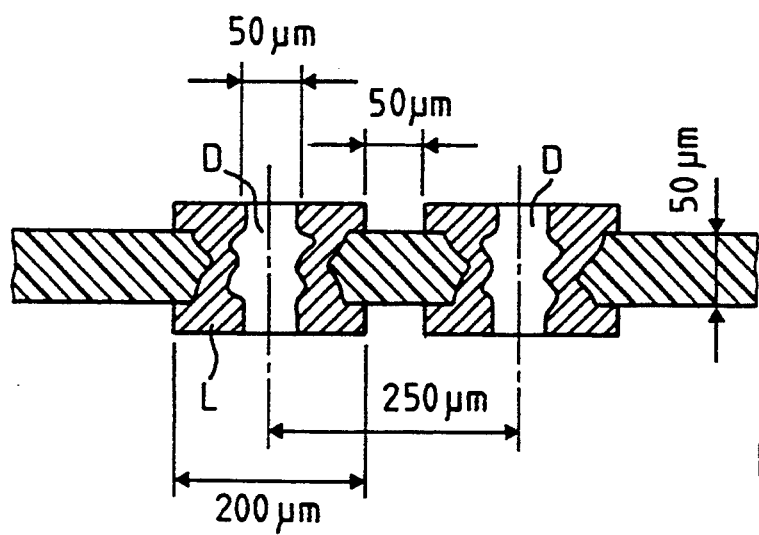
FIG. 4 is a side elevation, in section, of a printed circuit board showing typical sizes of plated-through holes in a foil circuit board in accordance with the invention.

FIG. 4 shows a section through an area of an typical foil circuit board with two conductor planes. The section shows two othogonal through-platings D and their sizes. The etched passages through the substrate with a thickness of 50 $\mu$m have a diameter of 50 $\mu$m. The lands L have a diameter of 200 $\mu$m. Between the lands a distance of 50 $\mu$m is provided.

Figure 5:
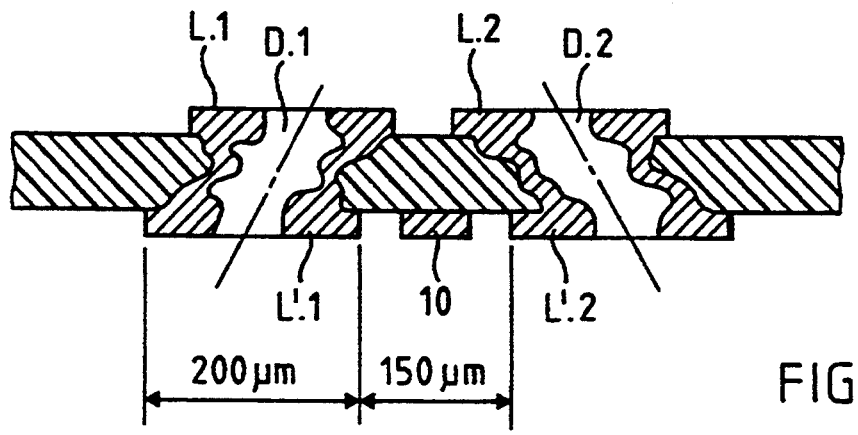
FIG. 5 is a side elevation, in section, of a printed circuit board showing typical sizes of plated-through oblique holes in a foil circuit board in accordance with the invention.

FIG. 5 shows an example for the independence obtainable between the two layouts of a circuit board similar to that shown in FIG. 4, when oblique through-platings D.1 and D.2 can be considered. The distance between two lands L.1 and L.2 on the upper layout is 50 $\mu$m (as in FIG. 4), and on the lower layout 150 $\mu$m, such that between the two lands L'.1 and L'.2, as shown, a conductor 10 can be provided.

Figure 6:
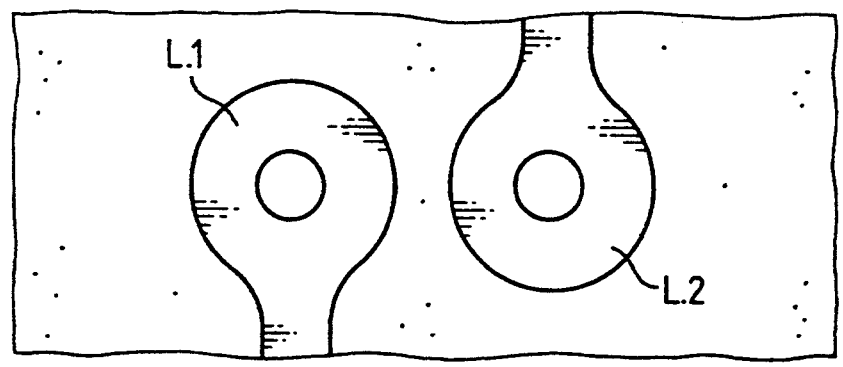
FIG. 6 is a top plan view of the circuit board of FIG. 5.
Figure 7:
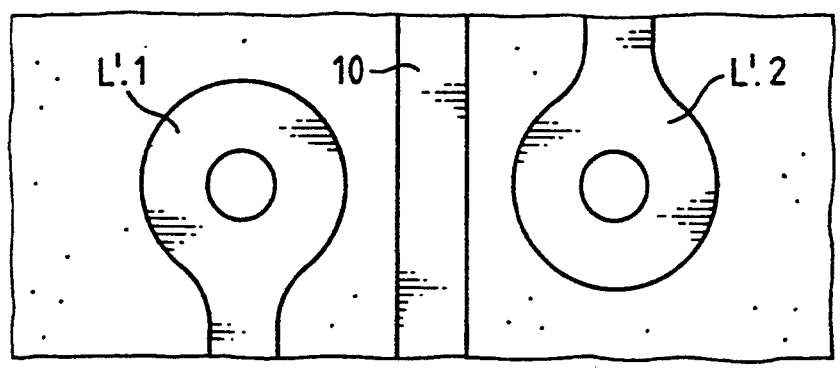
FIG. 7 is a bottom plan view of the circuit board of FIG. 5.

FIGS. 6 and 7 show views of the areas of the layouts of the circuit board as shown in section in FIG. 5.

Figure 8:
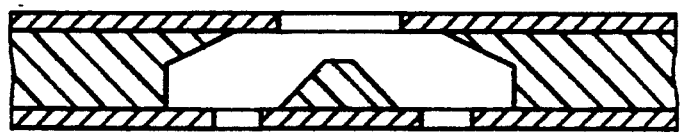
FIG. 8 is a side elevation, in section, of a printed circuit board showing a branched passage after etching.
Figure 9:
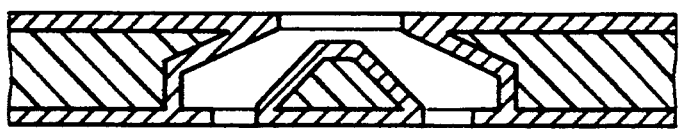
FIG. 9 is a side elevation, in section, of the branched passage of FIG. 9 after through-plating.
Figure 10:
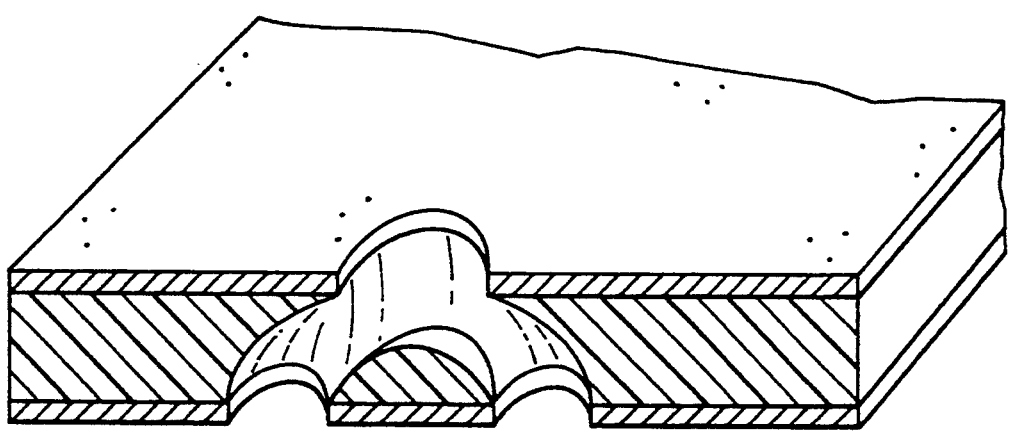
FIG. 10 is a partial perspective view, in section, of a passage leading from a single opening on one side of a printed circuit board to two openings on the other side.

FIG. 8 shows the logical further development of the idea, namely a clad foil e.g. for circuit board production with one passage opening on one side and two passage openings connected to the latter on the other side. The through-etching and under-etching are stylistically represented, but it is clear that the channels are interconnected. After plating-through (FIG. 9) a branched passage is obtained, which is usable for different purposes. FIG. 10 shows the same branched passage in a three-dimensional representation of a section.

Although the invention has only been tried out for thin 25 to 100 $\mu$m foils, it can also be used for thicker substrates. The physical limits are not set by the method per se but by the etching technology used.

For the plated-through holes, based on drilling technology, usually passages with round opening or mouths are produced. Using etching technology, e.g. plasma etching, it is also possible to obtain passages with different mouth or opening shapes, e.g. a square inlet opening and two oval outlet openings and so on. The passages can also be produced on substrates, which are not to be further processed to circuit boards. For such substrates it is then possible to adapt the openings of the passages to any connection form.

It is obviously possible to further process the two-layer circuit boards described and shown in the drawings to multi-layer foil circuit boards by applying further foil layers.

We claim:

1. A method for producing substrates comprising the steps of
   providing a foil substrate of non-metallic material with metal layers covering opposite surfaces of said foil substrate,
   forming openings through said metal layers at selected locations on opposite sides of said substrate, at least some of said openings being offset from each other with respect to lines perpendicular to the surfaces of said substrate,
   etching passages through said substrate between selected sets of said openings so that the passages interconnect desired openings, the passages interconnecting openings offset from each other following oblique lines forming a plurality of angles relative to the surfaces of the substrate, and wherein the step of etching passages includes controlling the etching of the material of the substrate at the locations of the openings in the metal layers until an amount of substrate material under the metal layers is etched away sufficient to form a passage between two openings having a maximum offset.

2. A method according to claim 1 wherein a set of said openings includes more than two openings.

3. A method according to claim 2 wherein an opening at one side of the substrate is connected by passages with more than one opening on the other side of the substrate.

4. A method according to claim 1 wherein, after the forming of passages, the metal layers are formed into preselected patterns.

5. A method according to claim 4 wherein said preselected patterns are printed circuit patterns and wherein selected areas of the metal layers are removed to leave conductive paths between the openings.

6. A method according to claim 5 and further including the step of plating the passages through the substrate with metal between the openings.

7. A method according to claim 1 and further including the step of plating the passages through the substrate with metal between the openings.

* * * * *